United States Patent
Furusawa

(10) Patent No.: US 11,920,215 B2
(45) Date of Patent: Mar. 5, 2024

(54) EASILY-CRUSHABLE COPPER POWDER AND MANUFACTURING METHOD THEREFOR

(71) Applicant: JX Metals Corporation, Tokyo (JP)

(72) Inventor: Hideki Furusawa, Ibaraki (JP)

(73) Assignee: JX Metals Corporation, Tokyo (JP)

(*) Notice: Subject to any disclaimer, the term of this patent is extended or adjusted under 35 U.S.C. 154(b) by 0 days.

(21) Appl. No.: 17/278,096

(22) PCT Filed: Jul. 24, 2019

(86) PCT No.: PCT/JP2019/029088
§ 371 (c)(1),
(2) Date: Mar. 19, 2021

(87) PCT Pub. No.: WO2020/059291
PCT Pub. Date: Mar. 26, 2020

(65) Prior Publication Data
US 2021/0346950 A1    Nov. 11, 2021

(30) Foreign Application Priority Data
Sep. 21, 2018   (JP) .................. 2018-177901

(51) Int. Cl.
*C22C 1/04*   (2023.01)
*B22F 1/145*   (2022.01)
*B22F 1/10*   (2022.01)
*B22F 1/14*   (2022.01)
(Continued)

(52) U.S. Cl.
CPC .............. *C22C 1/0425* (2013.01); *B22F 1/06* (2022.01); *B22F 1/10* (2022.01); *B22F 1/14* (2022.01); *B22F 1/145* (2022.01); *B22F 1/147* (2022.01); *B22F 1/102* (2022.01); *B22F 2301/10* (2013.01)

(58) Field of Classification Search
CPC ........ B22F 1/145; B22F 2301/10; B22F 1/06; B22F 1/147; B22F 1/10; B22F 1/14; B22F 1/102; C22C 1/0425
See application file for complete search history.

(56) References Cited

U.S. PATENT DOCUMENTS

| | | | |
|---|---|---|---|
| 6,391,087 B1 * | 5/2002 | Hayashi | B22F 9/24 75/373 |
| 2008/0019891 A1 * | 1/2008 | Huang | C22B 7/006 422/187 |
| 2012/0170241 A1 | 7/2012 | Nakako et al. | |

FOREIGN PATENT DOCUMENTS

| | | |
|---|---|---|
| EP | 3034202 A1 | 6/2016 |
| JP | 4164009 B2 * | 10/2008 |
| JP | 4164009 B2 | 10/2008 |

(Continued)

OTHER PUBLICATIONS

International Search Report for PCT/JP2019/029088, dated Oct. 8, 2019, 3 pages.

(Continued)

*Primary Examiner* — Ricardo D Morales
(74) *Attorney, Agent, or Firm* — Faegre Drinker Biddle & Reath LLP

(57) ABSTRACT

Provided is a copper powder manufactured by means of a wet method, wherein the absolute value of the zeta potential of the copper powder is at least 20 mV. The copper powder can be manufactured so as to reduce the burden of the steps of crushing a dry cake and classification, and there is a sufficient reduction in residual secondary particles.

8 Claims, 1 Drawing Sheet

(51) Int. Cl.
    *B22F 1/06*    (2022.01)
    *B22F 1/102*   (2022.01)

(56) References Cited

FOREIGN PATENT DOCUMENTS

| | | |
|---|---|---|
| JP | 2011017067 A | 1/2011 |
| JP | 2015002250 A | 1/2015 |
| JP | 6297018 B2 | 3/2018 |
| JP | 6549298 B1 | 7/2019 |
| JP | 2020050888 A | 4/2020 |
| JP | 2020050947 A | 4/2020 |
| KR | 20140125414 A1 | 10/2014 |
| TW | 201117231 A | 5/2011 |
| WO | 2011034019 A1 | 3/2011 |
| WO | 2013118893 A1 | 8/2013 |
| WO | 2013125659 A1 | 8/2013 |

OTHER PUBLICATIONS

Japan Office Action in corresponding application JP 2018-177901 dated Jan. 28, 2019, 6 pages (and translation).
Taiwan Office Action in corresponding application TW 108126720, 5 pages (and translation).
Extended European Search Report for Application No. 19863336.4 related to PCT/JP2019/029088 dated Oct. 18, 2021, 9 pages.
KR Office Action for corresponding Korean Patent Application No. 10-2021-7011008 dated Dec. 27, 2021 with machine Translation, 10 pages.
Japan Patent Office Action for corresponding Japan Patent Application No. 2019-059248 dated Jul. 20, 2022, with translation, 8 pages.

* cited by examiner

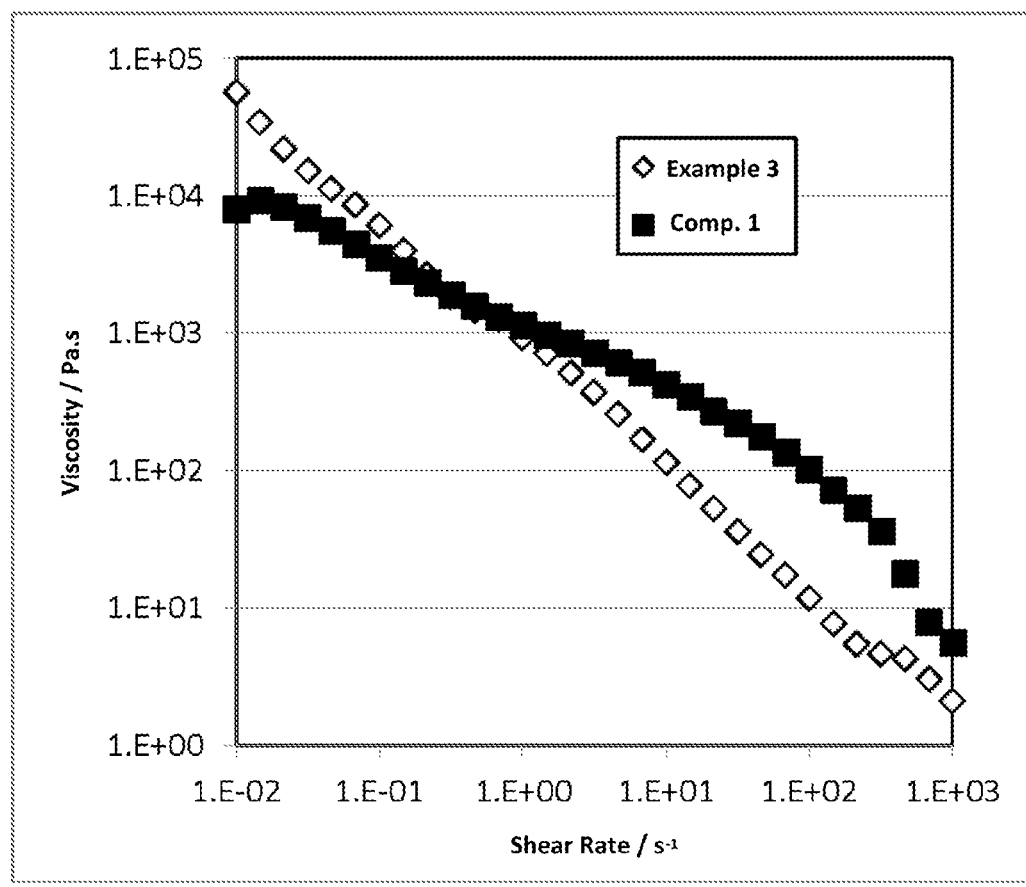

EASILY-CRUSHABLE COPPER POWDER AND MANUFACTURING METHOD THEREFOR

FIELD OF THE INVENTION

The present invention relates to easily-crushable copper powder and a method for manufacturing the same.

BACKGROUND OF THE INVENTION

Copper powder pastes have been widely used as electronic materials. For example, the copper powder pastes are applied and then sintered, and used for forming electrodes of laminated ceramic capacitors, and the like. As electrode layers used becomes thinner and pitches of wiring becomes narrower, finer copper powder is required as a paste material. For the production of copper powder having submicron size, a method of synthesizing copper powder by a wet method utilizing a chemical reduction or disproportionation method is used. Patent Literature 1 discloses a method for manufacturing a paste using copper powder. Patent Literature 2 discloses a method for manufacturing copper powder by a disproportionation method. Patent Literature 3 discloses a method for manufacturing copper powder by a chemical reduction method.

CITATION LIST

Patent Literatures

[Patent Literature 1]WO 2013/125659 A1
[Patent Literature 2]Japanese Patent No. 6297018 B
[Patent Literature 3]Japanese Patent No. 4164009 B

SUMMARY OF THE INVENTION

Technical Problem

The copper powder obtained by the wet method is once formed in the form of dried cake through a solid-liquid separation step. For the dried cake, the present inventors have found a phenomenon in which a lower size of copper powder causes copper powders to agglomerate with each other. If the agglomeration is left as it is, particles (secondary particles) formed by the agglomeration of the copper powders (primary particles) remain in the paste, which deteriorates properties of the copper powder paste. Therefore, a complicated process of crushing and classifying the dried cake is required for the dried cake having finer copper powders agglomerated with each other. Because of rough crushing required in this case, the crushing process by jet mill and the subsequent classifying step are complicated and also cause a lot of loss, which are heavily burdened on the manufacturing.

Therefore, an object of the present invention is to provide a copper powder that can be produced with reduced burden of the steps of crushing and classifying the dried cake, wherein residual secondary particles are sufficiently reduced.

Solution to Problem

As a result of intensive studies, the present inventors have found that the above object can be achieved by treating copper powder produced by the wet method under certain pH conditions.

Thus, the present invention includes the following aspect (1):

(1)

A copper powder produced by a wet method, wherein the copper powder has an absolute value of zeta potential of 20 mV or more.

Advantageous Effects of Invention

According to the present invention, it is possible to provide an easily crushable copper powder that can be produced with reduced burden of the steps of crushing and classifying the dried cake, wherein residual secondary particles are sufficiently reduced.

BRIEF DESCRIPTION OF THE DRAWINGS

FIG. 1 is a graph showing results of a viscosity measurement test.

DETAILED DESCRIPTION OF THE INVENTION

Hereinafter, the present invention will be described in detail with reference to embodiments. The present invention is not limited to the specific embodiments as described below.

[Easily-Crushable Copper Powder]

The copper powder according to the present invention is a copper powder produced by a wet method, wherein the copper powder has an absolute value of zeta potential of 20 mV or more.

Such a copper powder can lead to improved dispersibility of the copper powder due to repulsion of the copper powders (primary particles). In other words, such a copper powder can suppress the generation of aggregates (secondary particles) of the copper powder. This can result in the easily-crushable copper powder in which the residual secondary particles are sufficiently reduced while reducing the burden of the crushing and classification steps from the dried cake.

Such a copper powder is suitably used as metal powder for additive manufacturing (AM). As one aspect of the additive manufacturing, a technique is known for spreading metal powder to form a powder bed, and then spraying an ink containing an organic substance functioning as a binder onto the powder bed by an inkjet to form a formed body, which is sintered to provide a formed product. In such additive manufacturing, ink (binder) wettability is required for metal powder (powder bed). This is because poor ink wettability repels the metal powders and decreases additive manufacturing accuracy. In this respect, the above additive manufacturing using the easily-crushable copper powder exerts excellent dispersibility due to the repulsion of the copper powders (primary particles), so that the ink tends to flow into the copper powders, in other words, it has higher ink wettability and can achieve higher additive manufacturing accuracy.

[Easy Crushability]

The term "easily-crushable" means that it is easy to be crushed from a dried cake, and residual secondary particles are sufficiently reduced without performing a classification step, and specifically it means that when a dry coated film of a paste prepared under conditions of Examples as described below is formed on a slide glass, the film has a Ra of 0.2 μm or less and a Rz of 2 μm or less.

[Zeta Potential]

In a preferred embodiment, the copper powder according to the present invention can have an absolute value of zeta potential measured under a condition of pH 7, for example, in a range of 20 mV or more, and preferably from 20 to 100 mV. The zeta potential can be measured by a known means, and specifically, it can be measured by the means and conditions as described later in Examples.

[BET Specific Surface Area]

In a preferred embodiment, the copper powder according to the present invention can have a BET specific surface area of, for example, 2 $m^2$ $g^{-1}$ or more, and preferably 2 $m^2$ $g^{-1}$ or more and 100 $m^2$ $g^{-1}$ or less, and more preferably 2.5 $m^2$ $g^{-1}$ or more and 20 $m^2$ $g^{-1}$ or less, and even more preferably 3 $m^2$ $g^{-1}$ or more and 15 $m^2$ $g^{-1}$ or less. The BET specific surface area can be measured by a known means, and specifically, it can be measured by the means and conditions as described later in Examples.

[Carbon Deposition Amount]

In a preferred embodiment, the copper powder according to the present invention has an amount of carbon deposited to the copper powder, for example, in a range of from 0.1 to 0.6% by mass, and preferably in a range of from 0.1 to 0.5% by mass, and more preferably in a range of from 0.2 to 0.5% by mass, and still more preferably in a range of from 0.2 to 0.4% by mass, as a carbon deposition amount measured by the combustion method. The carbon deposition amount based on the combustion method can be measured by a known means, and specifically, it can be measured by the means and conditions as described later in Examples. The carbon deposition amount measured from the copper powder is derived from the step of manufacturing the copper powder by the wet method. If an amount of the additive containing carbon added is the same, the smaller the copper powder (copper powder having a larger specific surface area), the higher the carbon deposition amount. Further, the copper powder having a higher carbon deposition amount is more susceptible to a change of the zeta potential due to a pH treatment as described later. The present inventors believe that, in a preferred embodiment, the improved easy crushability can be achieved by using the copper powder having the combination of the specific carbon deposition amount and the zeta potential.

[TMA 1% Shrinkage Temperature]

In a preferred embodiment, the copper powder according to the present invention can have a TMA 1% shrinkage temperature in a range of, for example, 500° C. or less, and preferably from 200 to 500° C., and more preferably from 200 to 400° C. The TMA 1% shrinkage temperature can be measured by a known means, and specifically, it can be measured by the means and conditions as described later in Examples. That is, it can be measured using TMA 4000 from NETZSCH JAPAN Co., Ltd., and its conditions can be as follows: a powder density: 4.7 g/cm³; measurement atmosphere: nitrogen; a heating rate: 5° C./min; and load: 10 mN.

[Tap Density]

In a preferred embodiment, the copper powder according to the present invention can have a tap density (tight bulk density) of, for example, 3 g/cm³ or less, and preferably less than 3.0 g/cm³, and more preferably 2.9 g/cm³ or less, and even more preferably 2.9 g/cm³ or less, and even more preferably 2.5 g/cm³ or less. By making the tap density (tight bulk density) lower than the above upper limit, the dispersibility of the copper powder in the paste can be improved. The tap density can be measured by a known means, and specifically, it can be measured by the means and conditions as described later in Examples. That is, it can be measured using a powder tester PT-X from by Hosokawa Micron. More particularly, a guide is attached to a 10 cc cup, and the powder is placed therein and tapped 1000 times, and the guide is removed, and a part that exceeds a volume of 10 cc is leveled off, and the weight of the powder in the container is measured, whereby the tight bulk density can be determined.

In a preferred embodiment, the copper powder according to the invention has good dispersibility in the paste. The present inventors presume that this is related to the lower tap density (tight bulk density). The reason is not clear, but the present inventors believe that one of the factors is that there are many gaps generated between the dry powders if the tap density is lower in the state of dry powder, and solvents and resins can easily enter the gaps.

In a preferred embodiment, the copper powder according to the present invention is sufficiently crushed and hence has a large surface area. Therefore, the present inventors believe that the interaction with the solvent and the vehicle is increased in the paste, and the copper powder obtained in this case serves as a thickener in the paste. As will be described later, in a preferred embodiment, the paste obtained using the copper powder according to the present invention has a higher viscosity in a lower shear rate region and a lower viscosity in a higher shear rate region. The present inventors presumes that the viscosity is higher in the lower shear rate region because the interaction of the copper powder with the solvent, resin, and the like is higher. On the other hand, the present inventors presumes that the copper powder itself is sufficiently crushed in the higher shear rate region, so that the paste is easily deformed and has a lower viscosity as the shear rate increases. Such a paste is expected to have improved shape retention properties of a print pattern in terms of the behavior in the lower shear rate region and improved printability in terms of the behavior in the higher shear rate region. In a preferred embodiment, the copper powder according to the present invention may be used alone as a paste material, or may be mixed with larger micron size copper powder to increase the viscosity of the paste and adjust the printability. Further, in the latter case, since the copper powder itself according to the present invention has low-temperature sinterability, the sintering process proceeds as a whole paste, so that a sintered body having higher density can be obtained.

[Production of Easily-Crushable Copper Powder]

In a preferred embodiment, the easily-crushable copper powder according to the present invention can be produced by a method including a pH treatment step of bringing the copper powder produced by the wet method into contact with an aqueous alkaline solution having a pH of from 8 to 14 or an aqueous acidic solution having a pH of from 0 to 4.

[PH Treatment Step]

In a preferred embodiment, the pH treatment step is carried out by contact with an aqueous alkaline or acidic solution at the above pH. In a preferred embodiment, the contact can be carried out, for example, by stirring the copper powder produced by the wet method in the aqueous solution. The stirring can be carried out by, for example, a known means, and a stirring time which can be stirred using, for example, a rotary blade, a mixer, and a stirrer, is, for example, 5 minutes or more and 48 hours or less, and preferably 10 minutes or more and 24 hours or less. In a preferred embodiment, the contact can be carried out, for example, by passing the above aqueous solution through the copper powder produced by the wet method. The contact with the aqueous alkaline solution or the aqueous acidic solution may be carried out once, for example, in a batch process, or may be carried out a plurality of times. The copper powder after being contacted with the aqueous alkaline solution or the aqueous acidic solution can be subjected to solid-liquid separation by a known means to obtain a cake. In a preferred embodiment, the copper powder after being contacted with the aqueous alkaline solution or the aqueous acidic solution can be washed with pure water.

In a preferred embodiment, the washing with pure water can be carried out by a known means, for example, by passing pure water through the cake obtained by the solid-liquid separation.

[Aqueous Alkaline Solution]

In a preferred embodiment, the pH of the aqueous alkaline solution to be brought into contact with the copper powder produced by the wet method can have, for example, a pH of from 8 to 14, and preferably a pH of from 8 to 13, and more preferably a pH of from 9 to 13. Examples of the aqueous alkaline solution adjusted to the above pH that can be used include aqueous ammonia, an aqueous solution of sodium hydroxide, an aqueous solution of potassium hydroxide, an aqueous solution of an organic substance having an amino group(s) at a molecular terminal(s), or a mixed aqueous solution thereof.

[Aqueous Acidic Solution]

In a preferred embodiment, the pH of the aqueous acidic solution to be brought into contact with the copper powder produced by the wet method can have, for example, a pH of from 0 to 4, and preferably a pH of from 1 to 4, and more preferably a pH of from 1 to 3. Examples of the aqueous acidic solution adjusted to the above pH that can be used include an aqueous solution of an organic acid such as dilute sulfuric acid or methanesulfonic acid, or a mixed aqueous solution thereof.

[Drying]

In a preferred embodiment, the copper powder subjected to the pH treatment is then dried. The drying can be carried out by a known means, for example, at 60 to 300° C., and preferably 60 to 150° C., in a nitrogen atmosphere or a vacuum atmosphere. The copper powder thus obtained is often provided in the form of a dried cake.

[Crushing]

In a preferred embodiment, the copper powder subjected to the pH treatment followed by drying is then crushed. The crushing can be carried out by a known means, and, for example, a pestle, a mortar, or a mixer can be used. According to the present invention, the copper powder is sufficiently crushed by rough crushing with such a simple means to sufficiently reduce the secondary particles, and the step of crushing by the powerful crushing means and the step of classification which have been otherwise required in the prior art are not needed. Further, since any strong crushing means such as bead mill crushing using ceramic beads is not required, the natural shape of the copper powder produced by the wet method can be maintained, thereby avoiding any mechanically deformed shape. According to the present invention, the copper powder is sufficiently crushed by rough crushing with such a simple means. However, if desired, the present invention does not exclude subsequent mechanical crushing such as a Henschel mixer or jet mill crushing, or a subsequent classification step. The copper powder according to the present invention achieves easy crushability by the pH treatment and can be easily crushed, and sufficient crushing can be achieved by, for example, a pestle, a mortar, and a mixer. However, as a means for crushing easily-crushable copper powder, it does not exclude the use of a more powerful crushing means, for example, mechanical crushing such as Henschel mixer or jet mill crushing.

[Copper Powder Paste]

In a preferred embodiment, the easily-crushable copper powder according to the present invention can be suitably used as an embodiment of a copper powder paste containing the copper powder. The copper powder paste can be prepared, for example, by kneading easily-crushable copper powder with a binder resin and an organic solvent, and a glass frit may be further added if desired, and a dispersant and a thixotropic agent and/or an antifoaming agent may be further added if desired. In the easily-crushable copper powder according to the present invention, it is also sufficiently crushed by a simple means, and the primary particles repulse each other, so that a risk of subsequent reaggregation is reduced, and the primary particles are highly dispersed in the paste. Therefore, in the copper powder paste according to the present invention, an electrode obtained by printing and firing the paste has a smooth surface, and a risk of disconnection of the wiring is reduced.

Such a copper powder paste is suitably used as a metal ink for inkjet printing, because the metal ink for inkjet printing is required to have a property of not clogging a nozzle, but the easily-crushable copper powder as described above is difficult to clog the nozzle. This is due to the improved dispersibility of the easily-crushable copper powder and a difficulty to form secondary particles.

In a preferred embodiment, examples of the binder resin used in the paste include cellulose resins, acrylic resins, alkyd resins, polyvinyl alcohol resins, polyvinyl acetals, ketone resins, urea resins, melamine resins, polyester, polyamide, and polyurethane. The binder resin in the copper powder paste can be contained in a ratio of, for example, from 0.1 to 10% with respect to the mass of the copper powder. In a preferred embodiment, examples of the organic solvent include alcohol solvents (e.g., one or more selected from the group consisting of terpineol, dihydroterpineol, isopropyl alcohol, butyl carbitol, and terpineloxyethanol, dihydroterpineloxyethanol); glycol ether solvents (e.g., butyl carbitol); acetate solvents (e.g., one or more selected from the group consisting of butyl carbitol acetate, dihydroterpineol acetate, dihydrocarbitol acetate, carbitol acetate, linalyl acetate, terpinyl acetate); ketone solvent (e.g., methyl ethyl ketone); hydrocarbon solvents (e.g., one or more selected from the group consisting of toluene and cyclohexane); cellosolves (e.g., one or more selected from the group consisting of ethyl cellosolve and butyl cellosolve); and diethyl phthalate or propionate solvents (for example, one or more selected from the group consisting of dihydroterpinyl propionate, dihydrocarbyl propionate, and isobornyl propionate). In a preferred embodiment, examples of the glass frit that can be used include a glass frit having a diameter in a range of from 0.1 to 10 μm, and preferably from 0.1 to 5.0 μm. In a preferred embodiment, examples of the dispersant include oleic acid, stearic acid and oleylamine. In a preferred embodiment, examples of the antifoaming agent include organically modified polysiloxane and polyacrylate. In a preferred embodiment, the copper powder paste may contain from 30 to 90% by mass of copper powder, and from 0 to 5% by mass of the glass frit, the above mass ratio of the binder resin, the balance being the organic solvent, the dispersant, or the like, based on the mass of the copper powder paste. The kneading can be carried out using a known means. In a preferred embodiment, the preparation of the copper powder paste from the easily-crushable copper powder can be carried out, for example, according to the preparation of the paste disclosed in Patent Literature 1 (WO 2013/125659 A1).

[Sintered Body]

In a preferred embodiment, the copper powder paste containing the easily-crushable copper powder according to the present invention can be printed or coated as needed, and then sintered to obtain a sintered body. In a preferred embodiment, the obtained sintered body has a smooth surface.

In a preferred embodiment, after printing the copper powder paste containing the easily-crushable copper powder according to the present invention, a surface roughness Ra of the dried coated film is, for example, in a range of from 0.01 to 0.4 µm, and preferably in a range of from 0.01 to 0.3 µm. Since the roughness of the sintered body is actually affected by printing conditions in addition to dispersibility of the copper powder in the paste, the present method measures the roughness of the dry coated film in the sense of evaluating the dispersibility. The surface roughness Ra of the dry coated film can be measured by a known means, and specifically by the means and conditions as described later in Examples. The sintered body formed by sintering such a coated film can be suitably used as an electrode layer, a conductive layer, or the like in an electronic circuit or an electronic component. In a preferred embodiment, the easily-crushable copper powder according to the present invention can be sintered to form a sintered body.

In a preferred embodiment, the sintering can be carried out under known conditions, for example, by heating in a non-oxidizing atmosphere at a temperature in a range of from 200 to 1000° C. for 0.1 to 10 hours.

[Copper Powder Produced by Wet Method]

In a preferred embodiment, the copper powder subjected to the pH treatment step is copper powder produced by a wet method. The wet method includes a so-called disproportionation method and a so-called chemical reduction method.

In a preferred embodiment, as a method for producing copper powder by the disproportionation method, for example, a method disclosed in Patent Literature 2 (Japanese Patent No. 6297018 B) can be used. In a preferred embodiment, examples of the method for producing copper powder by the disproportionation method include a method including a step of adding cuprous oxide to an aqueous solvent containing a gum Arabic additive to prepare a slurry; and a step of adding dilute sulfuric acid in the slurry at once within 5 seconds to carry out a disproportionation reaction. In a preferred embodiment, the slurry can be maintained at room temperature (20 to 25° C.) or lower, and dilute sulfuric acid similarly maintained at room temperature or lower can be added to carry out the disproportionation reaction. In a preferred embodiment, the slurry can be maintained at 7° C. or lower, and dilute sulfuric acid similarly maintained at 7° C. or lower can be added to carry out the disproportionation reaction. In a preferred embodiment, the dilute sulfuric acid can be added so as to have a pH of 2.5 or less, and preferably pH 2.0 or less, and more preferably pH 1.5 or less. In a preferred embodiment, dilute sulfuric acid can be added to the slurry within 5 minutes, and preferably within 1 minute, and more preferably within 30 seconds, and even more preferably within 10 seconds, and even more preferably within 5 seconds. In a preferred embodiment, the disproportionation reaction can be completed in 10 minutes. In a preferred embodiment, the concentration of gum Arabic in the slurry can be from 0.229 to 1.143 g/L. As the cuprous oxide, cuprous oxide used by a known method, preferably cuprous oxide particles, can be used. The particle size and the like of the cuprous oxide particles have no direct relation to those of copper powder produced by the disproportionation reaction. Therefore, coarse cuprous oxide particles can be used. The principle of the disproportionation reaction is as follows:

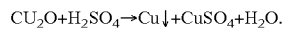

$$CU_2O + H_2SO_4 \rightarrow Cu\downarrow + CuSO_4 + H_2O.$$

The copper powder thus obtained may be washed and then subjected to the above pH treatment step in the form of the slurry, or may be formed into dried copper powder and then subjected to the above pH treatment step.

In a preferred embodiment, as a method for producing copper powder by the chemical reduction method, a method disclosed in Patent Literature 3 (Japanese Patent No. 4164009 B) can be used. In a preferred embodiment, examples of the method for producing copper powder by the chemical reduction method can include adding 2 g of gum Arabic to 2900 mL of pure water, and then adding 360 mL of 80% hydrazine monohydrate while adding 125 g of copper sulfate with stirring, and increasing a temperature from room temperature to 60° C. over 3 hours after the addition of hydrazine monohydrate, and allow copper oxide to react over further 3 hours, and at the end of the reaction, filtering the obtained slurry through Nutsche, then washing it with pure water and methanol, and further dried to obtain copper powder. The dried copper powder thus obtained may be subjected to the above pH treatment step, or may be subjected to the above pH treatment step in the form of the slurry.

Preferred Embodiment

The present invention includes the following embodiments of (1) to (12):

(1)

A copper powder produced by a wet method, the copper powder having an absolute value of zeta potential of 20 mV or more.

(2)

The copper powder according to (1), wherein the copper powder has a BET specific surface area of 2 m$^2$ g$^{-1}$ or more.

(3)

The copper powder according to (1) or (2), wherein the copper powder has a carbon adhesion amount in a range of from 0.1 to 0.6%.

(4)

The copper powder according to any one of (1) to (3), wherein the copper powder has a TMA 1% shrinkage temperature in a range of from 200 to 500° C.

(5)

The copper powder according to any one of (1) to (4), wherein the copper powder has a tap density of less than 3 gcm$^{-3}$.

(6)

The copper powder according to any one of (1) to (5), wherein the copper powder is an easily-crushable copper powder.

(7)

The copper powder according to any one of (1) to (6), wherein the copper powder is for additive manufacturing.

(8)

A copper powder paste, comprising the copper powder according to any one of (1) to (7).

(9)

The copper powder paste according to (8), wherein the copper powder paste is an ink for inkjet printing.

(10)

A sintered body obtained by sintering the copper powder according to any one of (1) to (7), or the copper powder paste according to (8) or (9).

(11)

A method for providing copper powder with easy crushability, the method comprising a pH treatment step of bringing copper powder produced by a wet method into contact with an aqueous alkaline solution having a pH of from 8 to 14 or an aqueous acidic solution having a pH of from 0 to 4.

(12)

A method for manufacturing easily-crushable copper powder, the method comprising a pH treatment step of bringing copper powder produced by a wet method into contact with an aqueous alkaline solution having a pH of from 8 to 14 or an aqueous acidic solution having a pH of from 0 to 4. including.

Therefore, the present invention includes an external electrode provided on a ceramic laminate, and a laminated ceramic product having the external electrode provided on the ceramic laminate, including laminated ceramic capacitors and laminated ceramic inductors.

EXAMPLES

Hereinafter, the present invention will be described in more detail with reference to Examples. It is to understand that the present invention is not limited to the following Examples.

Example 1

[Production of Copper Powder by Disproportionation Method (Power Production Method A)]

To a slurry consisting of 1 kg of cuprous oxide, 4 g of gum Arabic, and 7 L of pure water was instantaneously added 2.5 L of 25 vol % dilute sulfuric, and stirred at 500 rpm for 10 minutes. Once the copper powder obtained by this operation was sufficiently settled, a supernatant was removed, 7 L of pure water was added and stirred at 500 rpm for 10 minutes. This operation was repeated until a Cu concentration derived from $Cu^{2+}$ in the supernatant was less than 1 g/L. Subsequently, decantation was carried out to obtain a slurry of copper powder by the disproportionation method. The copper powder produced by the disproportionation method is designated as "A" in the production method in Table 1.

[PH Treatment]

The supernatant obtained by decantation was removed, and 500 g (wet mass) of the slurry of the precipitated copper powder was added to 1 L of aqueous ammonia adjusted to pH 8 and stirred. The stirring was carried out at 25° C. for 1 hour. Solid-liquid separation was then carried out by suction filtration to obtain a copper powder cake subjected to the pH treatment. The obtained cake was washed with pure water such that the pH of the pure water after filtration was less than 8 as a guide.

[Drying and Crushing]

The washed copper powder cake was dried in a nitrogen atmosphere at 100° C. to obtain a copper powder dried cake subjected to the pH treatment.

The obtained dried cake was roughly crushed with a pestle and a mortar. The copper powder according to Example 1 was thus obtained.

[Tap Density]

The tap density of the copper powder according to Example 1 was measured under the following conditions:

The measurement was carried out using Powder Tester PT-X from Hosokawa Micron Co., Ltd. A guide was attached to a 10 cc cup, and the powder was placed in the cap and tapped 1000 times. The guide was detached, and a part that exceeded the volume of 10 cc was leveled off, the powder placed in the container was weighed, and the tap density (tight bulk density) was determined.

[BET Specific Surface Area]

The BET specific surface area was measured for the copper powder according to Example 1 after pretreatment by heating at 200° C. for 5 hours in a vacuum using BELSORP-mini II from MicrotracBEL Corp.

[Carbon Adhesion Amount]

The carbon adhesion amount was measured for the copper powder according to Example 1 by the combustion method using CS 600 from LECO.

[TMA 1% Shrinkage Temperature]

The TMA 1% shrinkage temperature was measured for the copper powder according to Example 1 under the following conditions:

The measurement was carried out using TMA 4000 from NETZSCH Japan K.K. The conditions were as follows:

Compact density: 4.7 g/cm$^3$;

Measurement atmosphere: Nitrogen;

Heating rate: 5° C./min; and

Load: 10 mN.

[Zeta Potential]

The zeta potential of the copper powder according to Example 1 was measured as follows under the condition of pH 7:

The zeta potential of the powder was measured using the Malvern Panalytical Zetasizer Nano ZS. More specifically, about 50 mg of a sample was taken in a 50 mL sample bottle, into which an aqueous 0.1 wt % sodium hexametaphosphate solution was injected such that the total volume was 50 g, and irradiated with ultrasonic wave for 3 minutes. In this case, US-4R from AS ONE Corporation was used as the ultrasonic irradiation device, and an output was set to 180 W and a frequency was set to 40 kHz. Subsequently, 100 μL of the above dispersion was diluted with 900 μL of an aqueous 0.1% sodium hexametaphosphate solution, and 900 μL of the diluted dispersion was injected into a measurement cell with a micropipette. A liquid temperature was adjusted to 25° C.

[Surface Roughness Ra of Coated Film]

Terpineol and ethyl cellulose were previously sufficiently kneaded through a rotating and revolving mixer and three rolls to form a vehicle, and the vehicle, oleic acid and the copper powder of Example 1 were mixed such that the ratio of them was copper powder:ethyl cellulose:oleic acid:terpineol=80:2.3:1.6:16.1 (weight ratio), pre-kneaded with the rotating and revolving mixer, and then passed through the three rolls (a finishing roll gap of 5 μm), and defoamed using the rotating and revolving mixer. The resulting paste was coated on a slide glass using an applicator with a 25 μm gap, and dried at 120° C. for 10 minutes. The Ra of the resulting coated film in the coating direction was measured with a stylus type roughness meter according to JIS B 0601-2001, and calculated by averaging five points.

[Results]

Table 1 summarizes the results of the above measurements for the copper powder of Example 1.

Examples 2 to 6

[Production of Copper Powder by Disproportionation Method (Power Production Method A)]

A copper powder slurry was obtained by the disproportionation method in the same manner as that of Example 1.

[PH Treatment]

The pH treatment was carried out in the same manner as that of Example 1 to obtain a slurry of copper powder subjected to the pH treatment, with the exception that the pH of the aqueous ammonia used for the treatment was changed from that of Example 1 (Examples 2 to 4), or the stirring was carried out using dilute sulfuric acid adjusted to pH 1 (Example 5) or an aqueous potassium hydroxide solution adjusted to pH 13 in place of aqueous ammonia for 1 hour, and the solid-liquid separation was then carried out by suction filtration, the recovered cake was filtered with 5 L of dilute sulfuric acid having pH 1, and the cake was washed with pure water until the pH of the filtrate was more than 5 (Example 6).

Subsequently, solid-liquid separation was carried out by suction filtration to obtain a copper powder cake subjected to the pH treatment. The obtained cake was washed with pure water such that the pH of the pure water after filtration would exceed 5 as a guide.

However, in Example 6, the obtained cake was washed by suction filtration using 1250 mL of dilute sulfuric acid having a pH of 1 based on 100 g of copper powder, in place of the pure water.

The pH values used in Examples 2 to 6 are summarized in Table 1. It should be noted that the pH was adjusted by adding ammonia and dilute sulfuric acid as needed. Further, the treatment methods of the pH treatment are further summarized in Table 2.

[Drying and Crushing]

The copper powder cakes were treated in the same manner as that of Example 1 to obtain dried cakes, which were roughly crushed to obtain copper powders of Examples 2 to 6.

[Measurement and Results]

Table 1 summarizes the measurement results for the copper powders of Examples 2 to 6 in the same manner as that of Example 1.

Example 7

[Production of Copper Powder by Reduction Method (Power Production Method B)]

Copper powder was obtained by a chemical reduction method in accordance with Patent Literature 3 (Japanese Patent No. 4164009 B). That is, after adding 2 g of gum Arabic to 2900 mL of pure water, 125 g of copper sulfate was added and 360 mL of 80% hydrazine monohydrate was added with stirring. After the addition of hydrazine monohydrate, a temperature was increased from room temperature to 60° C. over 3 hours, and copper oxide was allowed to react for further 3 hours. At the end of the reaction, the resulting slurry was filtered through Nutsche, and filtration with pure water was repeated until the pH of the filtrate reached 7 to obtain a copper powder slurry. The slurry of copper powder was thus obtained by the reduction method. The copper powder produced by the reduction method is designated as "B" in the production method in Table 1.

[PH Treatment]

The resulting copper powder slurry was subjected to the same pH treatment as that of Example 1, with the exception that the pH of the aqueous ammonia used for the treatment was changed from that of Example 1 to obtain a cake of copper powder subjected to the pH treatment. The obtained cake was washed with pure water in the same manner as that of Example 1. The pH value used in Example 7 is shown in Table 1.

[Drying and Crushing]

The copper powder cake was treated in the same manner as that of Example 1 to obtain a dried cake, which was roughly crushed to obtain a copper powder of Example 7.

[Measurement and Results]

Table 1 summarizes the measurement results for the copper powder of Example 7 in the same manner as that of Example 1.

Examples 8 and 9

[Production of Copper Powder by Reduction Method (Power Production Method B)]

Slurries of copper powders were obtained by the reduction method in the same manner as that of Example 7.

[PH Treatment]

The pH treatment was carried out in the same manner as that of Example 1, with the exception that dilute sulfuric acid adjusted to pH 3 or pH 1 (Examples 8 and 9) was used in place of the aqueous ammonia to obtain cakes of copper powders subjected to the pH treatment. The obtained cakes were washed with pure water until the pH of the filtrate exceeded 5. The pH values used in Examples 8 and 9 are summarized in Table 1.

[Drying and Crushing]

The slurries of copper powders subjected to the pH treatment were treated in the same manner as that of Example 1 to obtain dried cakes, which were roughly crushed to obtain copper powders of Examples 8 and 9.

[Measurement and Results]

Table 1 summarizes the measurement results for the copper powders of Examples 8 and 9 in the same manner as that of Example 1.

Comparative Example 1

[Production of Copper Powder by Disproportionation Method (Power Production Method A)]

A copper powder slurry was obtained by the disproportionation method in the same manner as that of Example 1.

[Drying and Crushing]

A dried cake was obtained from the copper powder slurry in the same manner as that of Example 1, with the exception that the pH treatment was not carried out, and the obtained dried cake was roughly crushed to obtain a copper powder of Comparative Example 1.

Table 1 summarizes the measurement results for the copper powder of Comparative Example 1 in the same manner as that of Example 1.

Comparative Example 2

[Production of Copper Powder by Reduction Method (Power Production Method B)]

A slurry of copper powder was obtained by the reduction method in the same manner as that of Example 7.

[Drying and Crushing]

A dried cake was obtained from the copper powder slurry in the same manner as that of Example 1, with the exception that the pH treatment was not carried out, and the obtained dried cake was roughly crushed to obtain a copper powder of Comparative Example 2.

Table 1 summarizes the measurement results for the copper powder of Comparative Example 2 in the same manner as that of Example 1.

TABLE 1

| | | Copper Powder Production Method | Treatment Method | Treatment pH | Tap Density/ g cm$^{-3}$ | BET/ m$^2$ g$^{-1}$ | C/% | TMA 1% Shrinkage Temperature/° C. | Zeta Potential/ mV | Ra of Coated Film/μm |
|---|---|---|---|---|---|---|---|---|---|---|
| Examples | 1 | A | 1 | 8 | 2.8 | 3.2 | 0.24 | 310 | −35 | 0.13 |
| | 2 | A | 1 | 10 | 2.5 | 3.3 | 0.23 | 310 | −45 | 0.09 |
| | 3 | A | 1 | 13 | 2.3 | 3.4 | 0.22 | 240 | −50 | 0.07 |
| | 4 | A | 1 | 13 | 2.2 | 4.1 | 0.41 | 290 | −82 | 0.05 |
| | 5 | A | 2 | 1 | 2.9 | 3.2 | 0.24 | 330 | −40 | 0.11 |
| | 6 | A | 3 | 13 | 2.6 | 3.2 | 0.22 | 320 | −60 | 0.07 |
| | 7 | B | 1 | 13 | 2.4 | 3.4 | 0.22 | 320 | −40 | 0.05 |
| | 8 | B | 2 | 3 | 2.2 | 3.1 | 0.24 | 320 | −35 | 0.17 |
| | 9 | B | 2 | 1 | 2.3 | 3.3 | 0.24 | 310 | −30 | 0.13 |
| Comparative Examples | 1 | A | — | — | 3.2 | 3.1 | 0.25 | 320 | −5.9 | 0.41 |
| | 2 | B | — | — | 3.1 | 3.0 | 0.24 | 330 | −3.5 | 0.4 |

TABLE 2

| | | First Time | Second Time |
|---|---|---|---|
| Treatment # | pH | Others | pH |
| 1 | Alkali* | Stirring Time: 1 h | — |
| 2 | Acid*** | Stirring Time: 1 h | — |
| 3 | Alkali**** | Stirring Time: 1 h | Acid** |

*Aqueous ammonia adjusted to the predetermined pH
**Cake was washed by suction filtration using 1250 ml of dilute sulfuric acid having pH 1 based on 100 g of copper powder
***Dilute sulfuric acid adjusted to the predetermined pH
****The alkali was an aqueous potassium hydroxide solution adjusted to the predetermined pH

[Viscosity Measurement Test]

Using the copper powders of Example 3 and Comparative Example 1, pastes were prepared in the same manner as that of Example 1. The viscosity of each paste obtained was measured using an E-type viscometer MCR 102 (a cone plate having 2°, 25° C., a shear rate range of from 0.01 to 1000 s$^{-1}$). The results are shown in FIG. 1. As shown in FIG. 1, the viscosity of the paste using the copper powder of Example 3 is higher in the lower shear rate region of 0.2 s$^{-1}$ or less, whereas the viscosity of the paste using the copper powder of Example 3 is lower in the shear rate region of more than 10 s$^{-1}$. Thus, the paste of the copper powder according to the present invention had improved shape retention properties in terms of the behavior in the lower shear rate region, and improved printability in terms of the behavior in the higher shear rate region.

INDUSTRIAL APPLICABILITY

The present invention provides easily-crushable copper powder. The present invention is an industrially useful invention.

The invention claimed is:

1. A method for providing copper powder with easy crushability, the method comprising a pH treatment step comprising bringing copper consisting of copper powder produced by a wet method into contact with an aqueous alkaline solution having a pH of from 8 to 14 or an aqueous acidic solution having a pH of from 0 to 4, wherein said copper powder produced by a wet method has not undergone a form of dried cake after being produced by the wet method and prior to being brought into contact with the aqueous alkaline solution or aqueous acidic solution.

2. A method for manufacturing easily-crushable copper powder, the method comprising a pH treatment step comprising bringing copper consisting of copper powder produced by a wet method into contact with an aqueous alkaline solution having a pH of from 8 to 14 or an aqueous acidic solution having a pH of from 0 to 4, wherein said copper powder produced by a wet method has not undergone a form of dried cake after being produced by the wet method and prior to being brought into contact with the aqueous alkaline solution or aqueous acidic solution.

3. The method according to claim 1, the copper powder produced by a wet method is in the form of slurry of the copper powder.

4. The method according to the claim 2, the copper powder produced by a wet method is in the form of slurry of the copper powder.

5. The method according to the claim 1, after the pH treatment step the method further comprising steps of:
   obtaining a copper powder dried cake by washing the copper powder subjected to the pH treatment and then drying the copper powder, and
   crushing the copper powder dried cake.

6. The method according to the claim 2, after the pH treatment step the method further comprising steps of:
   obtaining a copper powder dried cake by washing the copper powder subjected to the pH treatment and then drying the copper powder, and
   crushing the copper powder dried cake.

7. The method according to the claim 3, after the pH treatment step the method further comprising steps of:
   obtaining a copper powder dried cake by washing the copper powder subjected to the pH treatment and then drying the copper powder, and
   crushing the copper powder dried cake.

8. The method according to the claim 4, after the pH treatment step the method further comprising steps of:
   obtaining a copper powder dried cake by washing the copper powder subjected to the pH treatment and then drying the copper powder, and
   crushing the copper powder dried cake.

* * * * *